(12) United States Patent
Lee et al.

(10) Patent No.: US 8,518,779 B2
(45) Date of Patent: Aug. 27, 2013

(54) SEMICONDUCTOR DEVICE AND METHOD FOR FABRICATING THE SAME

(75) Inventors: Jin-Yul Lee, Gyeonggi-do (KR); Dong-Seok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/532,170

(22) Filed: Jun. 25, 2012

(65) Prior Publication Data

US 2012/0264266 A1 Oct. 18, 2012

Related U.S. Application Data

(62) Division of application No. 12/492,607, filed on Jun. 26, 2009, now Pat. No. 8,227,859.

(30) Foreign Application Priority Data

Jul. 4, 2008 (KR) .......................... 10-2008-0064937

(51) Int. Cl.
*H01L 21/336* (2006.01)

(52) U.S. Cl.
USPC .......................................................... 438/270

(58) Field of Classification Search
USPC .......................................................... 438/270
See application file for complete search history.

(56) References Cited

U.S. PATENT DOCUMENTS 5,072,276 A * 12/1991 Malhi et al. .................... 257/372
2008/0173933 A1 * 7/2008 Fukuzumi et al. ............. 257/324

* cited by examiner

*Primary Examiner* — Calvin Lee
*Assistant Examiner* — Monica D Harrison
(74) *Attorney, Agent, or Firm* — IP & T Group LLP

(57) ABSTRACT

A semiconductor device includes a step-type recess pattern formed in a substrate, a gate electrode buried in the recess pattern and having a gap disposed between the gate electrode and upper sidewalls of the recess pattern, an insulation layer filling the gap, and a source and drain region formed in a portion of the substrate at two sides of the recess pattern. The semiconductor device is able to secure a required data retention time by suppressing the increase of leakage current caused by the reduction of a design rule.

36 Claims, 13 Drawing Sheets

SEMICONDUCTOR DEVICE AND METHOD FOR FABRICATING THE SAME

CROSS-REFERENCE TO RELATED APPLICATION

This application is a division of U.S. patent application Ser. No. 12/492,607 filed on Jun. 26, 2009 now U.S. Pat. No. 8,227,859, which claims priority of Korean Patent Application No. 10-2008-0064937 filed on Jul. 4, 2008. The disclosure of each of the foregoing applications is incorporated herein by reference in its entirety.

BACKGROUND OF THE INVENTION

The present invention relates to technology for fabricating a semiconductor device, and more particularly, to a semiconductor device and a method for fabricating the same, capable of securing a data retention time desired in the semiconductor device employing 40 nm manufacturing processes.

Recently, because of a high degree of integration of a semiconductor device, it has been difficult to secure stable operational characteristics of a transistor. Moreover, as manufacturing processes of a semiconductor memory device has rapidly decreased to 40 nm manufacturing processes, the size of a cell transistor is also reduced and thus characteristic margins such as a threshold voltage, a current drivability, an operational speed and a data retention time margin are reaching their limitations.

In particular, in a semiconductor memory device where 40 nm manufacturing processes is applied, it has been difficult to secure the desired data retention time margin with appropriate characteristic margins. This is because gate induced drain leakage (GIDL) occurring in a region where a source and drain region overlaps with a gate electrode rapidly increases as the size of the transistor is reduced.

This GIDL due to the tunneling of electrons generated between the source and drain region and the gate electrode may be removed/reduced by reducing the region where the source and drain region overlaps with the gate electrode through the forming of a shallow junction of the source and drain region, or increasing the thickness of a gate insulation layer disposed between the source and drain region and the gate electrode. However, as the size of the transistor decreases, the thickness of the gate insulation layer is also inevitably reduced. Therefore, it becomes difficult to maintain an adequate thickness of the gate insulation layer and prevent the increase of a leakage current due to the GIDL. Accordingly, in order to prevent the increase of the leakage current due to the GIDL, the source and drain region are desired to be formed to have the shallow junction, thereby reducing the region where the source and drain region overlaps with the gate electrode. For this purpose, a method for applying an elevated source/drain (ESD) structure to a transistor is introduced.

The ESD structure is formed by a method for forming a source and drain region having a shallow junction. That is, after forming an epitaxial layer only in a region where the source and drain region is to be formed through an epitaxial growth method, e.g., a selective epitaxial growth (SEG) method, the source and drain region having the shallow junction is formed by doping impurities into the epitaxial layer.

FIGS. 1A and 1B illustrate a method for fabricating a conventional semiconductor device. Herein, FIGS. 1A and 1B illustrate a semiconductor device having a channel with a saddle fin structure.

Referring to FIG. 1A, a first recess pattern 14 is formed in an active region 13 by etching a substrate 11 where the active region 13 is defined by an isolation layer 12. A second recess pattern 15 is formed in the isolation layer 12 to form the saddle fin structure where a lower surface and a lower side of the first recess pattern 14 protrude.

Then, after forming a gate 19 to fill the first recess pattern 14 and the second recess pattern 15, a gate spacer 20 is formed on sidewalls of the gate 19, wherein the gate 19 includes a gate insulation layer 16, a gate electrode 17 and a gate hard mask layer 18 that are sequentially stacked.

Subsequently, after forming an inter-layer insulation layer 21 filling a space between the gates 19 over the entire surface of the substrate 11, a contact hole 22 is formed to expose a surface of a portion of the substrate 11 where a source and drain region is to be formed by performing a self aligned contact (SAC) etch process. Then, an epitaxial layer 23 partially filling the contact hole 22 is formed using an epitaxial growth method.

Referring to FIG. 1B, the source and drain region 24 is formed to have a shallow junction by doping impurities into the epitaxial layer 23.

However, in the semiconductor device where 40 nm manufacturing processes is applied, since an area of the substrate 11 exposed after the SAC etching process is relatively narrow and the exposed area of the substrate 11 is not uniform over the substrate 11, it is relatively difficult to form the epitaxial layer 23 using the epitaxial growth method and it takes a considerable amount of time to form the epitaxial layer 23.

Furthermore, the epitaxial layer 23 is not uniformly formed over the substrate 11, referring to a portion indicated by a reference numeral A in FIG. 1A, or the epitaxial layer 23 is formed abnormally, referring to a portion indicated by a reference numeral B in FIG. 1A, by the damage 25 of the substrate 11 and by-products 26 generated during the SAC etch process.

That is, in case the epitaxial layer 23 is not uniformly formed over the substrate 11, it is difficult to adjust a junction depth of the source and drain region 24. Accordingly, as can be seen from a portion indicated by a reference numeral C in FIG. 1B, the junction depth of the source and drain region 24 is increased and thus it is impossible to form an elevated source/drain structure. Meanwhile, in case the epitaxial layer 23 is abnormally formed, as can be seen from a portion indicated by a reference numeral D in FIG. 1B, the source and drain region 24 is also abnormally formed, so that the performance of the semiconductor device is deteriorated or the semiconductor device does not normally operate.

Moreover, in the process of forming the epitaxial layer 23 using the epitaxial growth method, the high temperature of approximately 700° C. to approximately 800° C. is desired in general and thus there occur thermal stress and out-diffusion of impurities pre-doped before the epitaxial layer 23 is formed, which may result in the deterioration of the performance of the semiconductor device.

SUMMARY OF THE INVENTION

An embodiment of the present invention is directed to providing a semiconductor device and a method for fabricating the same, capable of providing a data retention time required in the semiconductor device where 40 nm manufacturing processes is applied.

Another embodiment of the present invention is directed to providing a semiconductor device including an elevated source/drain structure without using an epitaxial growth method, and a method for fabricating the semiconductor device, wherein 40 nm manufacturing processes is applied to the semiconductor device.

In accordance with an aspect of the present invention, there is provided a semiconductor device including: a step-type recess pattern formed in a substrate; a gate electrode buried in the recess pattern and having a gap disposed between the gate electrode and upper sidewalls of the recess pattern; an insulation layer filling the gap; and a source and drain region formed in a portion of the substrate at two sides of the recess pattern.

The recess pattern may include a first pattern, and a second pattern connected to a bottom of the first pattern and having the width smaller than the width of the first pattern, and the depth of the second pattern may be greater than the depth of the first pattern.

The width of the gate electrode may be equal to or greater than the width of the second pattern.

The method may further include a gate insulation layer formed between the recess pattern and the gate electrode, wherein the width of the gap may be greater than the thickness of the gate insulation layer.

The insulation layer may fill the gap and cover sidewalls of the gate electrode. The insulation layer may include a single layer or a stacked layer selected from a group consisting of an oxide layer, a nitride layer and an oxynitride layer.

A work function of the source and drain region may be equal to a work function of the gate electrode, or an absolute value of the work function difference of the source and drain region and the gate electrode may be smaller than 0.5 eV.

The gate electrode may include a single layer formed of a semiconductor layer or a metallic layer, or a stacked layer of the semiconductor layer and the metallic layer.

The semiconductor layer may include a polysilicon layer and the metallic layer may include a tungsten layer.

In accordance with another aspect of the present invention, there is provided a semiconductor device including: a step-type saddle fin recess pattern formed in a substrate including an active region and an isolation region; a gate electrode buried in the recess pattern and having a gap disposed between the gate electrode and upper sidewalls of the recess pattern; an insulation layer filling the gap; and a source and drain region formed in a portion of the substrate at two sides of the recess pattern.

The recess pattern may include a line shape crossing both of the isolation region and the active region.

The recess pattern may include a first pattern crossing the isolation region and the active region at the same time, a second pattern connected to a bottom of the first pattern in the active region and having the width smaller than the width of the first pattern, and a third pattern connected to the bottom of the first pattern in the isolation region, having the width smaller than the width of the first pattern, and exposing a lower surface and lower sidewalls of the second pattern with a saddle fin structure.

The width of the second pattern may be substantially the same as the width of the third pattern.

Among the first to third patterns, the third pattern may have the greatest depth and the first pattern may have the smallest depth.

The width of the gate electrode may be equal to or greater than the width of the second pattern.

The method may further include a gate insulation layer formed between the recess pattern and the gate electrode, wherein the width of the gap may be greater than the thickness of the gate insulation layer.

The insulation layer may fill the gap and cover sidewalls of the gate electrode.

The insulation layer may include a single layer or a stacked layer selected from a group consisting of an oxide layer, a nitride layer and an oxynitride layer.

A work function of the source and drain region may be equal to a work function of the gate electrode, or an absolute value of the work function difference of the source and drain region and the gate electrode may be smaller than 0.5 eV.

The gate electrode may include a single layer formed of a semiconductor layer or a metallic layer, or a stacked layer of the semiconductor layer and the metallic layer.

The semiconductor layer may include a polysilicon layer and the metallic layer comprises a tungsten layer.

In accordance with another aspect of the present invention, there is provided a method for fabricating a semiconductor device, the method including: forming a step-type recess pattern in a substrate; forming a gate electrode filling the recess pattern and having a gap disposed between the gate electrode and upper sidewalls of the recess pattern; forming an insulation layer filling the gap; and forming a source and drain region by doping impurities into the substrate.

The forming of the recess pattern may include: performing a first etching of the substrate using a first etch barrier pattern as an etch barrier to form a first pattern; forming a second etch barrier pattern on sidewalls of the first pattern and sidewalls of the first etch barrier pattern; and performing a second etching of the substrate using the first and second etch barrier patterns as an etch barrier to form a second pattern that is connected to a bottom of the first pattern and has the width smaller than the width of the first pattern.

The performing a first etching and the performing a second etching may be performed using a dry etch method.

The depth of the second pattern may be greater than the depth of the first pattern.

The first etch barrier pattern may include an amorphous carbon layer.

The second etch barrier pattern may include a nitride layer.

The nitride layer may be formed at the temperature of approximately 400° C. to approximately 500° C.

The width of the gate electrode may be equal to or greater than the width of the second pattern.

The method may further include forming a gate insulation layer between the recess pattern and the gate electrode, wherein the width of the gap may be greater than the thickness of the gate insulation layer.

The insulation layer may include a single layer or a stacked layer selected from a group consisting of an oxide layer, a nitride layer and an oxynitride layer.

The forming of the insulation layer may include forming an insulating layer filling the gap and covering the entire surface of the substrate, and performing an overall etch process on the insulating layer to remain the insulating layer on sidewalls of the gate electrode, thereby forming the insulation layer.

The forming of the source and drain region may include forming a conductive layer containing impurities over the substrate, and performing thermal treatment to diffuse the impurities contained in the conductive layer into the substrate.

The forming of the source and drain region may include: ion-implanting first impurities into the substrate; forming a conductive layer containing second impurities over the substrate; and performing thermal treatment to diffuse the second impurities contained in the conductive layer into the substrate at the same time of activating the first impurities ion-implanted into the substrate.

The first impurities and the second impurities may have the same conductive type.

A work function of the source and drain region may be equal to a work function of the gate electrode, or an absolute value of the work function difference of the source and drain region and the gate electrode may be smaller than 0.5 eV.

The gate electrode may include a single layer formed of a semiconductor layer or a metallic layer, or a stacked layer of the semiconductor layer and the metallic layer.

The semiconductor layer may include a polysilicon layer and the metallic layer may include a tungsten layer.

In accordance with another aspect of the present invention, there is provided a method for fabricating a semiconductor device, the method including: forming a step-type saddle fin recess pattern by selectively etching a substrate including an active region and an isolation region; forming a gate electrode having a gap disposed between the gate electrode and upper sidewalls of the recess pattern and filling the recess pattern; forming an insulation layer filling the gap; and forming a source and drain region by doping impurities into the substrate.

The recess pattern may include a line shape crossing both of the isolation region and the active region.

The forming of the recess pattern may include: performing a first etching of the substrate using a first etch barrier pattern as an etch barrier to form a first pattern crossing the isolation region and the active region at the same time; forming a second etch barrier pattern on sidewalls of the first pattern and sidewalls of the first etch barrier pattern; performing a second etching of the substrate using the first and second etch barrier patterns as an etch barrier to form a second pattern that is connected to a bottom of the first pattern and has the width smaller than the width of the first pattern; and performing a third etching of the isolation region using the first and second etch barrier patterns as an etch barrier to form a third pattern connected to the bottom of the first pattern, having the width smaller than the width of the first pattern, and exposing a lower surface and lower sidewalls of the second pattern with a saddle fin structure.

The performing a first etching, the performing a second etching and the performing a third etching may be performed using a dry etch method.

The performing a second etching and the performing a third etching may be performed in-situ.

Among the first to third patterns, the third pattern may have the greatest depth and the first pattern may have the smallest depth.

The first etch barrier pattern may include an amorphous carbon layer.

The second etch barrier pattern may include a nitride layer.

The nitride layer may be formed at the temperature of approximately 400° C. to approximately 500° C.

The width of the gate electrode may be equal to or greater than the width of the second pattern.

The method may further include forming a gate insulation layer between the recess pattern and the gate electrode, wherein the width of the gap may be greater than the thickness of the gate insulation layer.

The insulation layer may include a single layer or a stacked layer selected from a group consisting of an oxide layer, a nitride layer and an oxynitride layer.

The forming of the insulation layer may include: forming an insulating layer filling the gap and covering the entire surface of the substrate; and performing an overall etch process on the insulating layer to remain the insulating layer on sidewalls of the gate electrode, thereby forming the insulation layer.

The forming of the source and drain region may include: forming a conductive layer containing impurities over the substrate; and performing thermal treatment to diffuse the impurities contained in the conductive layer into the substrate.

The forming of the source and drain region may include: ion-implanting first impurities into the substrate; forming a conductive layer containing second impurities over the substrate; and performing thermal treatment to diffuse the second impurities contained in the conductive layer into the substrate at the same time of activating the first impurities ion-implanted into the substrate.

The first impurities and the second impurities may have the same conductive type.

A work function of the source and drain region may be equal to a work function of the gate electrode, or an absolute value of the work function difference of the source and drain region and the gate electrode may be smaller than 0.5 eV.

The gate electrode may include a single layer constructed of a semiconductor layer or a metallic layer, or a stacked layer of the semiconductor layer and the metallic layer.

The semiconductor layer may include a polysilicon layer and the metallic layer may include a tungsten layer.

DESCRIPTION OF SPECIFIC EMBODIMENTS

Figure 1A:
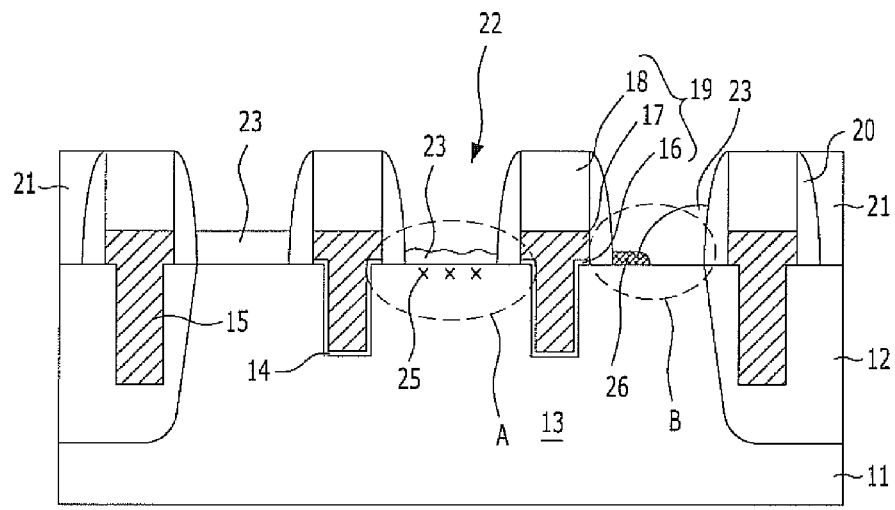
FIGS. 1A and 1B illustrate a method for fabricating a conventional semiconductor device.
Figure 1B:
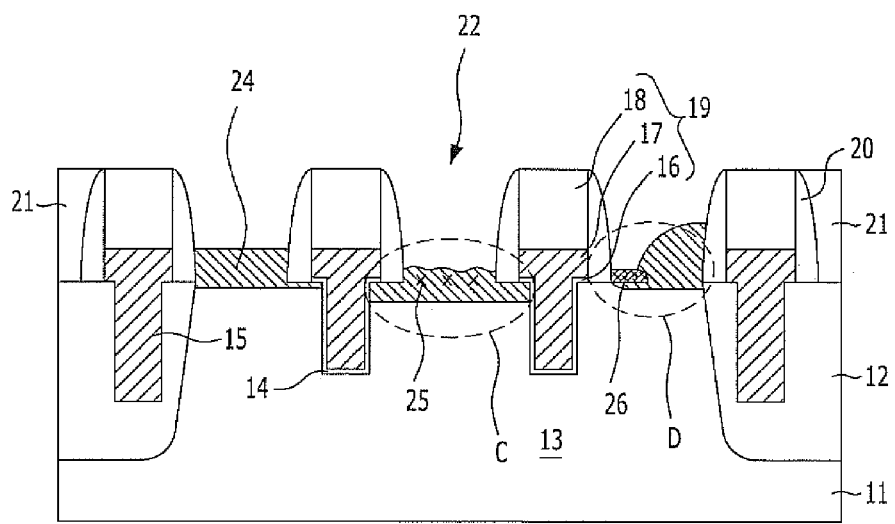

Other objects and advantages of the present invention can be understood by the following description, and become apparent with reference to the embodiments of the present invention.

Referring to the drawings, the illustrated thickness of layers and regions are exemplary and my not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they may appear in different embodiments or drawings of the present invention.

The present invention provides a semiconductor device capable of securing characteristic margins such as a threshold voltage, a current drivability, an operational speed and a data retention time margin required in the semiconductor device where 40 nm manufacturing processes is applied, and a method for fabricating the semiconductor device. In particular, the present invention provides a method for fabricating a semiconductor device capable of effectively securing the data retention time margin among the above-described characteristic margins.

For these purposes, the present invention employs an elevated source/drain structure to reduce a leakage current which reduces the data retention time margin in a semiconductor device such as a dynamic random access memory (DRAM) device and, specially, to reduce gate induced drain leakage (GIDL) occurring in a space between a source and drain region and a gate electrode. Herein, the present invention does not use an epitaxial growth method to form the elevated source/drain structure. Instead, the present invention employs technology of elevating a region where the source and drain region is to be formed by selectively etching a substrate before forming a gate.

Hereinafter, a first embodiment of the present invention illustrates the case where the above technology is applied to a semiconductor device having a channel with a recess structure.

Figure 2A:
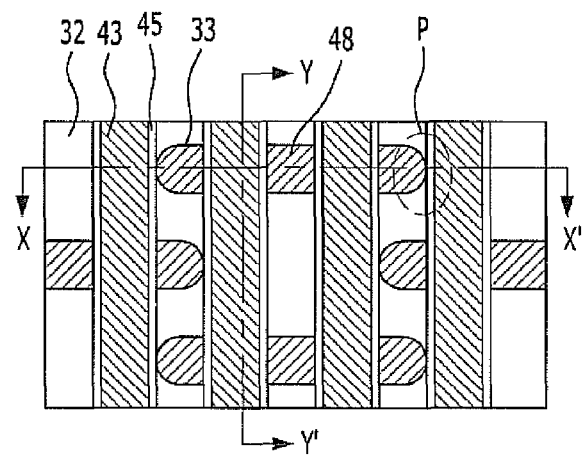
FIGS. 2A to 2C illustrate a semiconductor device in accordance with a first embodiment of the present invention.
Figure 2B:
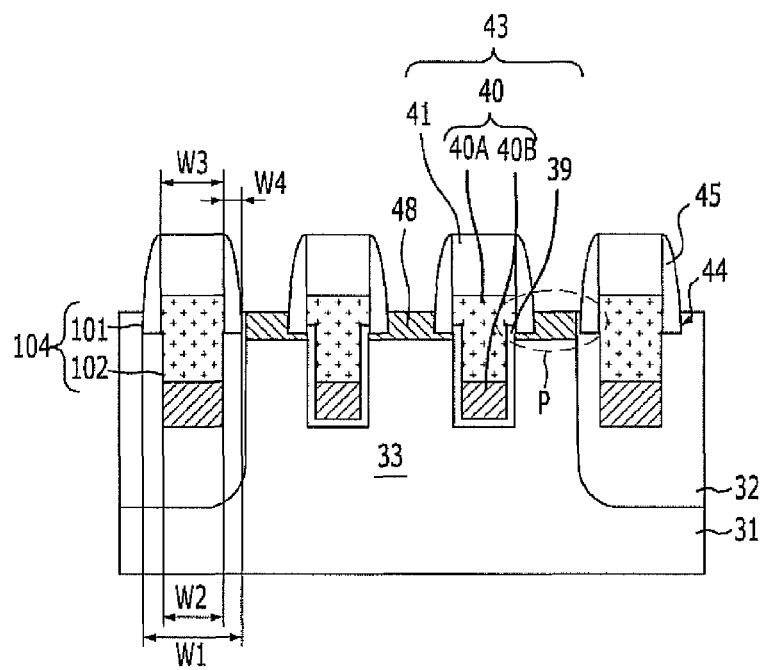
Figure 2C:
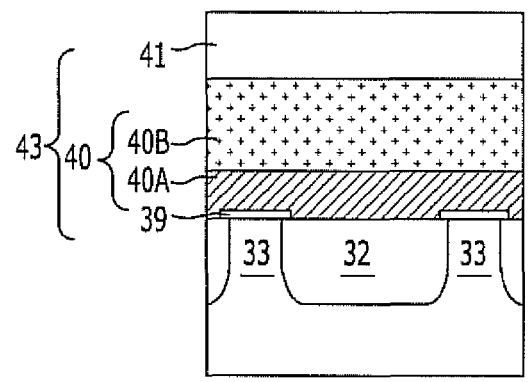

FIGS. 2A to 2C illustrate the semiconductor device in accordance with the first embodiment of the present invention. Herein, FIG. 2A shows a plane view of the semiconductor device; FIG. 2B illustrates a cross-sectional view taken along a line X-X' described in FIG. 2A; and FIG. 2C illustrates a cross-sectional view taken along a line Y-Y' described in FIG. 2A.

Referring to FIGS. 2A to 2C, the semiconductor device includes a step-type recess pattern 104 in a substrate 31, a gate electrode 40 buried in the recess pattern 104 and having a gap 44 disposed between the gate electrode 40 and both sidewalls at an upper portion of the recess pattern 104, an insulation layer 45 buried in the gap 44, and a source and drain region 48 formed in a portion of the substrate 31 at two sides of the recess pattern 104 and having a shallow junction. Moreover, the semiconductor device may include an active region 33 defined by an isolation layer 32. Herein, in general, a region where the isolation layer 32 is formed is referred to as an isolation region and the remaining region in the substrate 31 except the isolation region is referred to as the active region 33.

The step-type recess pattern 104 may include a first pattern 101 and a second pattern 102, wherein the second pattern 102 is connected to a lower portion of the first pattern 101 and has the width smaller than that of the first pattern 101. That is, the width W1 of the first pattern 101 is greater than the width W2 of the second pattern 102. Herein, the depth of the second pattern 102 may be greater than that of the first pattern 101. Furthermore, the recess pattern 104 may have a line shape, which crosses both of the isolation region and the active region 33 at the same time. In order to effectively prevent the increase of a leakage current, the recess pattern 104 may be formed to have the depth less than that of the isolation layer 32 with respect to a surface of the substrate 31.

Hereinafter, the detailed description for the step-type recess pattern 104 will be provided.

First of all, the first pattern 101 is to provide the elevated source and drain region 48 without using the epitaxial growth method. The depth of the first pattern 101 can be adjusted by considering the junction depth of the elevated source/drain structure. In particular, the first pattern 101 has the depth that is substantially the same as the junction depth of the elevated source/drain structure required in the semiconductor device from the surface of the substrate 31. The depth of the first pattern 101 may be in a range of approximately 500 Å to approximately 800 Å.

The second pattern 102 is to provide the channel with the recess structure. The channel having the recess structure increases the effective channel length of the semiconductor device and thus prevents the increase of a leakage current and variation of a threshold voltage due to the decrease of the channel length according to the smaller-scale manufacturing processes. Therefore, it is preferable to adjust the depth of the second pattern 102 by considering the channel length of the channel having the recess structure. In particular, the depth of the second pattern 102 may be in a range of approximately 800 Å to approximately 1200 Å from a bottom of the first pattern 101.

The width W3 of the gate electrode 40 may be equal to or greater than the width W2 of the second pattern 102 (W3≧W2) and smaller than the width W1 of the first pattern (W1>W3). Therefore, the gap 44 may be generated between the upper sidewalls of the recess pattern 104 it) and the gate electrode 40.

The gap 44 suppresses the generation of the leakage current, e.g., the GIDL, between the source and drain region 48 and the gate electrode 40 as well as suppressing the generation of the interference, i.e., a passing gate effect, between the gate electrode 40 formed in the active region 33 and the gate electrode 40 formed in the isolation region. At this time, in order to effectively suppress the generation of the GIDL and the passing gate effect, it is preferable to form the gap 44 having the width W4 greater than the thickness of a gate insulation layer 39, wherein the gate insulation layer 39 is formed to be disposed between the recess pattern 104 and the gate electrode 40.

The insulation layer 45 filling the gap 44 plays a role of suppressing the generation of the GIDL and the passing gate effect practically and can cover the sidewalls of the gate electrode 40 at the same time of filling the gap 44. That is, the insulation layer 45 filling the gap 44 may have a gate spacer structure.

The insulation layer 45 filling the gap 44 may be a single layer or a stacked layer selected from a group consisting of an oxide layer, a nitride layer and an oxynitride layer. The oxide layer may include a high density plasma (HDP) oxide layer, a tetra ethyle ortho silicate (TEOS) layer and so on; the nitride layer may include a silicon nitride ($Si_3N_4$) layer; and the oxynitride layer may include a silicon oxynitride (SION) layer.

Hereinafter, a principle that the gap 44 and the insulation layer 45 filling the gap 44 suppress the generation of the GIDL will be described in detail.

In general, the GIDL is mainly generated in a region where the to source and drain region 48 overlaps with the gate insulation layer 39 and the gate electrode 40. By forming the source and drain region 48 having the shallow junction with the elevated source/drain structure, it is possible to reduce the region where the source and drain region 48 overlaps with the gate insulation layer 39 and the gate electrode 40. As is a result, it is possible to reduce the GIDL generated in the region where the source and drain region 48 overlaps with the gate insulation layer 39 and the gate electrode 40.

However, in the elevated source/drain structure, the generation of the GIDL may increase instead in a region having a surface higher than the surface of the substrate 31, i.e., a region where the elevated source and drain region 48, the insulation layer 45 filling the gap 44 and the gate electrode 40 overlap with each other. Therefore, the gap 44 is formed to have the width W4 greater than the thickness of the gate insulation layer 39 and thus the insulation layer 45 filling the gap 44 is formed to have the thickness greater than the thickness of the gate insulation layer 39, so that the generation of the GIDL between the insulation layer 45 and the gate insulation layer 39 can be suppressed. More specifically, the leakage current due to the GIDL is caused by the tunneling of electrons generated between the gate electrode 40 and the source and drain region 48. Accordingly, it is possible to more effectively prevent the tunneling of the electrons as a barrier disposed between the gate electrode 40 and the source and drain region 48, i.e., the thickness of the insulation layer 45 filling the gap 44 and the gate insulation layer 39, gets greater.

Herein, in order to more effectively prevent the tunneling of the electrodes between the source and drain region 48 and the gate electrode 40, it is preferable that a work function of the source and drain region 48 is the same as that of the gate electrode 40, or an absolute value of the difference between the work functions of the source and drain region 48 and the gate electrode 40 is adjusted to be smaller than 0.5 eV. That is because a high potential barrier is formed between the source and drain region 48 and the gate electrode 40 in a state where a bias is not supplied from the outside and thus excessive band bending is required so as to produce active tunneling of electrons between the source and drain region 48 and the gate electrode 40. In order to form the high potential barrier between the source and drain region 48 and the gate electrode 40, the absolute value of the difference between the work functions of the source and drain region 48 and the gate electrode 40 should be relatively large. Accordingly, when adjusting the work functions of the source and drain region 48 and the gate electrode 40 to become equal to each other or the absolute value of the difference between the work functions to become smaller than 0.5 eV, it is possible to prevent the excessive band bending from being generated between the source and drain region 48 and the gate electrode 40. As a result, it is possible to effectively suppress the generation of the GIDL.

For instance, in case the source and drain region 48 is formed by doping N-type impurities, e.g., phosphorous (P) of $1 \times 10^{18}$ atoms/cm3, into a silicon substrate, the work function of the source and drain region 48 becomes approximately 3.9 eV. At this point, in order to effectively prevent the generation of the GIDL, it is preferable that the work function of the gate electrode 40 is in a range of approximately 3.4 eV to approximately 4.4 eV. Therefore, in the above case, the gate electrode 40 may use silver (Ag) having a work function of 4.26 eV, aluminum (Al) having a work function of 4.28 eV, titanium (Ti) having a work function of 4.33 eV and so on. If it is impossible to adjust a material constructing the gate electrode 40, the difference of the work functions between the source and drain region 48 and the gate electrode 40 may be controlled by adjusting the impurity doping concentration of the source and drain region 48.

Hereinafter, a principle as to how the gap 44 and the insulation layer 45 filling the gap 44 prevent the passing gate effect will be described in detail.

In general, a resultant structure including the gate electrode 40, i.e., a gate 43, passes the active region 33 and the isolation region at the same time. At this point, the gate 43 passing the active region 33 is referred to as a main gate and the gate 43 passing the isolation region is referred to as a passing gate. Herein, as a degree of integration of the semiconductor device increases, a physical distance between the main gate and the passing gate is reduced. Therefore, a threshold voltage of the main gate is changed or parasitic capacitance between the main gate and the passing gate increases by the influence of a bias voltage supplied to the passing gate. This kind of phenomenon is referred to as the passing gate effect.

This passing gate effect occurs in a region that is adjacent to the surface of the substrate 31 and where the active region 33 and the isolation layer 32 adjoin each other, such as a region indicated by a reference numeral 'P' in FIGS. 2A and 2B. Thus, as the recess pattern 104 is formed in the isolation layer 32 in order to reduce a delay time of signal transmission in a circuit, the passing gate effect becomes more serious. This is because the physical distance between the main gate and the passing gate is reduced more as the recess pattern 104 is formed in the isolation layer 32 as well.

However, although the recess pattern 104 is also formed in the isolation layer 32, it is possible to decrease the passing gate effect by securing a physical space between the gate electrode 40 and the recess pattern 104 through the forming of the gap 44 between the upper sidewalls of the recess pattern 104 and the gate electrode 40. Moreover, it is possible to effectively prevent the interference between the main gate and the passing gate, i.e., the passing gate effect, by filling the gap 44 with the insulation layer 45.

Furthermore, the embodiment of the present invention may include a gate hard mask layer 41 formed on the gate electrode 40 and the gate insulation layer 39, wherein the gate insulation layer 39 is disposed between the recess pattern 104 and the gate electrode 40. Herein, a structure where the gate insulation layer 39, the gate electrode 40 and the gate hard mask layer 41 are sequentially stacked is called the gate 43. The width W3 of the gate electrode 40 is substantially the same as that of the gate 43.

The gate insulation layer 39 may include a silicon oxide ($SiO_2$) layer and have the thickness of approximately 30 Å to approximately 60 Å. The gate electrode 40 may be formed of a single layer or a stacked layer selected from a group consisting of a semiconductor layer, e.g., a polysilicon layer, a metallic layer and a conductive organic layer. The metallic layer may include a tungsten (W) layer, an aluminum (Al) layer, a titanium nitride (TiN) layer, an iridium oxide ($IrO_2$) layer, a titanium silicide (TiSi) layer, a tungsten silicide (WSi) layer, an indium tin oxide (ITO) layer, an indium zinc oxide (IZO) layer, and so on. The conductive organic layer may include pentacene, tetracene, anthracene, and so on.

For instance, when the gate electrode 40 includes the stacked layer, the polysilicon layer 40A having an relatively superior interface characteristic for the silicon oxide layer, i.e., the gate insulation layer 39, may be formed to have the thickness of approximately 400 Å to approximately 700 Å and then the metallic layer 40B, e.g., the tungsten silicide (WSi) layer or the tungsten (W) layer, whose resistivity is less than that of the polysilicon layer 40A may be formed on the polysilicon layer 40A to have the thickness of approximately 1000 Å to approximately 1500 Å to thereby improve a signal transmission characteristic.

The gate hard mask layer 41 may be formed of a single layer or a stacked layer selected from a group consisting of an oxide layer, a nitride layer, an oxynitride layer and an amorphous carbon layer and have the thickness of approximately 2000 Å to approximately 2500 Å to provide a sufficient etch margin between fabricating processes.

As described above, the semiconductor device in accordance with the first embodiment of the present invention can suppress the increase of the GIDL due to smaller-scale manufacturing processes by forming the source and drain region 48 having the shallow junction through the recess pattern 104, specially, the first pattern 101.

In addition, the present invention can increase the channel length by including the source and drain region 48 having the shallow junction and thus effectively suppress the increase of the leakage current according to smaller-scale manufacturing processes.

The generation of the GIDL may be effectively suppressed by forming the insulation layer 45, filling the gap 44, to have the thickness that is greater than the thickness of the gate insulation layer 39.

Moreover, the present invention can effectively suppress the generation of the GIDL by adjusting the difference of the work functions of the source and drain region 48 and the gate electrode 40.

As a result, it is possible to secure the data retention time required in a high density semiconductor device, e.g., the semiconductor device fabricated with 40 nm manufacturing processes.

Furthermore, the present invention can suppress the passing gate effect by employing the insulation layer 45 filling the gap 44.

Hereinafter, in a second embodiment of the present invention, there will be described the case the technical principle of the present invention is applied to a semiconductor device having a channel with a saddle fin structure, wherein the channel with the saddle fin structure is formed by combining a channel with a recess structure and a channel with a fin structure. The semiconductor device in accordance with the second embodiment includes the channel with the fin structure and thus can enhance current drivability and an operational speed compared to the semiconductor device in accordance with the first embodiment. Detailed description for the parts of the second embodiment that are identical to those of the first embodiment will be omitted.

Figure 3A:
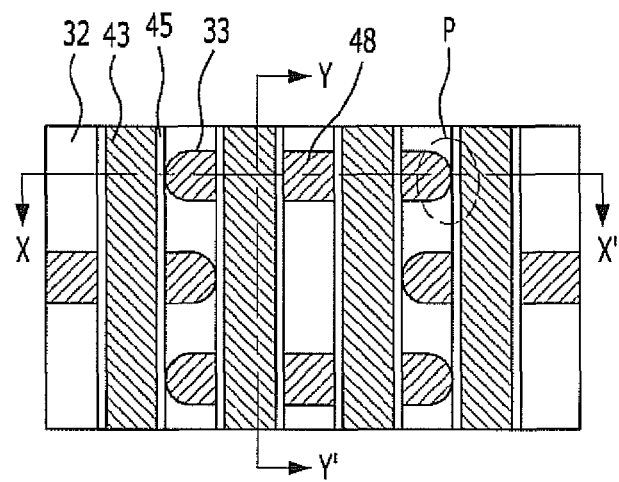
FIGS. 3A to 3C illustrate a semiconductor device in accordance with a second embodiment of the present invention.
Figure 3B:
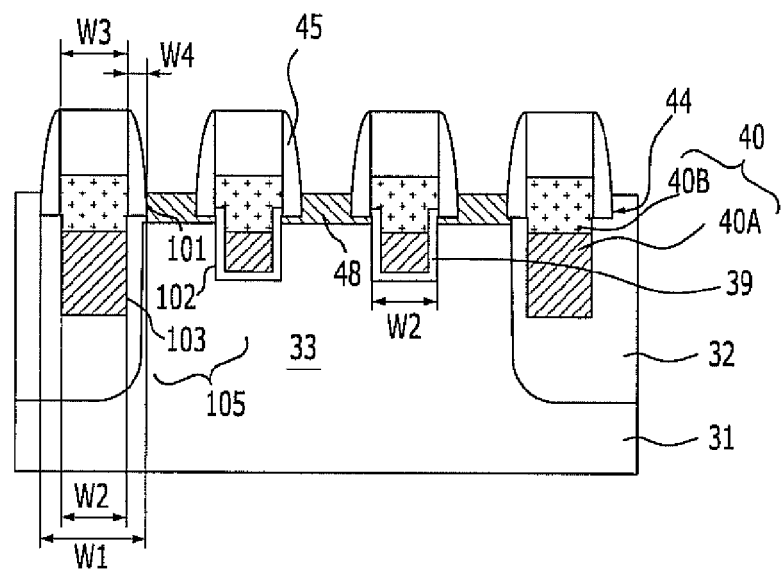
Figure 3C:
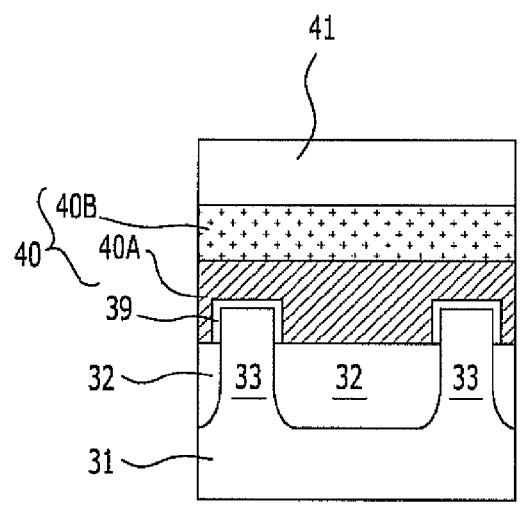

FIGS. 3A to 3C illustrate the semiconductor device in accordance with the second embodiment of the present invention. Herein, FIG. 3A shows a plane view of the semiconductor device; FIG. 3B illustrates a cross-sectional view taken along a line X-X' described in FIG. 3A; and FIG. 3C illustrates a cross-sectional view taken along a line Y-Y' described in FIG. 3A. In FIGS. 3A to 3C, the same components as those in the first embodiment are indicated by the same reference numerals as those in FIGS. 2A to 2C.

As illustrated in FIGS. 3A to 3C, the semiconductor device in accordance with the second embodiment of the present invention includes a step-type saddle fin recess pattern 105 formed in a substrate 31 having an active region 33 and an isolation region where an isolation layer 32 is formed in the substrate 31, a gate electrode 40 filling the recess pattern 105 and having a gap 44 disposed between the gate electrode 40 and upper sidewalls of the recess pattern 105, an insulation layer 45 filling the gap 44 and a source and drain region 48 formed in a portion of the substrate 31 at two sides of the recess pattern 105 and having a shallow junction.

The recess pattern 105 may have a line shape, which crosses the isolation region and the active region 33 at the same time. Furthermore, the recess pattern 105 may include a first pattern 101 crossing the isolation region and the active region 33 at the same time, a second pattern 102 connected to a lower portion of the first pattern 101 in the active region 33 and having the width smaller than that of the first pattern 101, and a third pattern 103 connected to a lower portion of the first pattern 101 in the isolation region, having the width smaller than that of the first pattern 101 and exposing a bottom and lower sidewalls of the second pattern 102 with the saddle fin structure. Herein, the width W2 of the second pattern 102 is substantially the same as the width W3 of the third pattern 103 and the width W1 of the first pattern 101 is greater than the width W2 of the second pattern 102. Moreover, the depth of the second pattern 102 may be greater than the depth of the first pattern 101 and the depth of the third pattern 103 may be greater than the depth of the second pattern 102.

The step-type saddle fin recess pattern 105 will be described in detail hereinafter.

First of all, the first pattern 101 is to provide an elevated source and drain region without using an epitaxial growth method and thus the depth of the first pattern 101 may be adjusted by considering the junction depth of an elevated source/drain structure. In particular, the first pattern 101 may have the depth that has substantially the same level as that of the junction depth of the elevated source/drain structure required in the semiconductor device from a surface of the substrate 31. For instance, the first pattern 101 has the depth of approximately 500 Å to approximately 800 Å.

The second pattern 102 is to provide the channel with the recess structure. The channel with the recess structure can prevent the increase of the leakage current and the variation of a threshold voltage due to the reduction of the channel length according to smaller-scale manufacturing processes by increasing the effective channel length of the semiconductor device. Therefore, the depth of the second pattern 102 can be adjusted by considering the channel length in the recess structure. In particular, the depth of the second pattern 102 may be in a range of approximately 800 Å to approximately 1200 Å from the bottom of the first pattern 101 to provide the channel length required in the semiconductor device where 40 nm manufacturing processes is applied. Accordingly, the depth of the second pattern 102 may be greater than the depth of the first pattern 101.

The third pattern 103 is to provide the channel with the fin structure. The channel with the fin structure plays a role of securing characteristic margins such as an operational speed and a current drivability margin of the semiconductor device by enhancing the controllability of the gate electrode 40 for the channel. Therefore, it is preferable to adjust the depth of the third pattern 103 by considering the channel length required in the channel with the fin structure, i.e., the bottom and lower sidewalls of the second pattern 102 that are exposed. In particular, it is preferable that the third pattern 103 has a bottom that is approximately 300 Å to approximately 600 Å lower than the bottom of the second pattern 102 by considering the channel length required in the channel with the fin structure. Therefore, the depth of the third pattern 103 is greater than the depth of the second pattern 102.

Furthermore, it is preferable to form the second pattern 102 and the third pattern 103 to have the depth less than the depth of the isolation layer 32 from the surface of the substrate 31 by considering an electrical characteristic of the semiconductor device. This is to prevent an electrical short and interference between the substrate 31 and the gate electrode 40 buried in the third pattern 103. In addition, this is to prevent interference between the gate electrode 40 buried in the second pattern 102 and the active region 33 adjacent to the gate electrode 40.

The width W3 of the gate electrode 40 may be equal to or greater than the width W2 of the second pattern 102, i.e., W3≧W2, and preferably smaller than the width W1 of the first pattern 101, i.e., W1>W3. Thus, the gap 44 may be formed between the upper sidewalls of the recess pattern 105 and the gate electrode 40.

The gap 44 plays a role of suppressing the generation of a leakage current between the source and drain region 48 and the gate electrode 40, e.g., the GIDL, and at the same time preventing the interference, i.e., the passing gate effect, from being generated in a region, indicated by a reference numeral 'P' in FIG. 3A, between the gate electrode 40 formed in the active region 33 and the gate electrode 40 formed in the isolation region. At this point, in order to more effectively suppress the generation of the GIDL and the passing gate effect, it is preferable that the width W4 of the gap 44 is greater than the thickness of a gate insulation layer 39 disposed between the recess pattern 105 and the gate electrode 40.

The insulation layer 45 filling the gap 44 practically plays a role of prevent the generation of the GIDL and the passing gate effect and can cover the sidewalls of the gate electrode 40 as well as filling the gap 44. That is, the insulation layer 45 filling the gap 44 may have a gate spacer structure.

Furthermore, the insulation layer 45 filling the gap 44 may be formed of a single layer or a stacked layer selected from a group consisting of an oxide layer, a nitride layer and an oxynitride layer.

Hereinafter, a principle that the gap 44 and the insulation layer 45 filling the gap 44 suppress the generation of the GIDL and prevent the passing gate effect will be briefly described since the detailed description thereof was shown with reference to FIGS. 2A to 2C.

The embodiment of the present invention may further include a gate hard mask layer 41 formed on the gate electrode 40 and the gate insulation layer 39 disposed between the recess pattern 104 and the gate electrode 40. Therefore, a structure where the gate insulation layer 39, the gate electrode 40 and the gate hard mask layer 41 are sequentially stacked is called a gate and the width W3 of the gate electrode 40 is substantially the same as the width of the gate.

The gate electrode 40 may be formed of a single layer or a stacked layer selected from a group consisting of a polysilicon layer, a metallic layer and a conductive organic layer. The metallic layer may is include a W layer, an Al layer, a TiN layer, an $IrO_2$ layer, a TiSi layer, a WSi layer, an ITO layer, an IZO layer, and so on. The conductive organic layer may include pentacene, tetracene, anthracene, and so on.

For instance, when the gate electrode 40 is formed of the stacked layer, the polysilicon layer 40A having an relatively superior interface characteristic for the silicon oxide layer, i.e., the gate insulation layer 39, may be formed to have the thickness of approximately 400 Å to approximately 700 Å and then the metallic layer 40B, e.g., the tungsten silicide layer or the tungsten layer, whose resistivity is less than that of the polysilicon layer 40A may be formed on the polysilicon layer 40A to have the thickness of approximately 1000 Å to approximately 1500 Å to thereby improve a signal transmission characteristic.

Herein, it is preferable to adjust a work function of the source and drain region 48 to be equal to that of the gate electrode 40 or an absolute value of the difference between the work functions of the source and drain region 48 and the gate electrode 40 to be less than 0.5 eV. This was described in detail above with reference to FIGS. 2A to 2C and thus the detailed description thereof is omitted herein.

As described above, since the second embodiment of the present invention forms the source and drain region 48 having the shallow junction through the recess pattern 105, especially, the first pattern 101, it is possible to suppress the increase of the GIDL due to smaller-scale manufacturing processes.

In addition, the present invention can increase the channel length by including the source and drain region 48 having the shallow junction and thus effectively suppress the increase of the leakage current due to smaller-scale manufacturing processes.

The generation of the GIDL may be effectively suppressed by forming the insulation layer 45, filling the gap 44, to have the thickness greater than the thickness of the gate insulation layer 39.

Moreover, the present invention can much more effectively suppress the generation of the GIDL by adjusting the difference between the work functions of the source and drain region 48 and the gate electrode 40.

As a result, it is possible to secure the data retention time margin required in a high density semiconductor device.

Moreover, the present invention can enhance the current drivability and an operational speed of the semiconductor device by providing the channel with the fin structure through the use of the third pattern 103.

Furthermore, the present invention can suppress the passing gate effect by employing the insulation layer 45 filling the gap 44.

Hereinafter, a method for fabricating the semiconductor device in accordance with the first and second embodiments of the present invention will be described. Herein, the method for fabricating the semiconductor device in accordance with the second embodiment of the present invention will be illustrated as an example.

FIGS. 4A to 9C illustrate the method for fabricating the semiconductor device in accordance with the second embodiment of the present invention. Herein, for FIGS. 4A to 9C, FIG. NA shows a plane view of the semiconductor device; FIG. NB illustrates a cross-sectional view taken along a line X-X' described in FIG. NA; and FIG. NC illustrates a cross-sectional view taken along a line Y-Y' described in FIG. NA, N being 4 to 9.

Figure 4A:
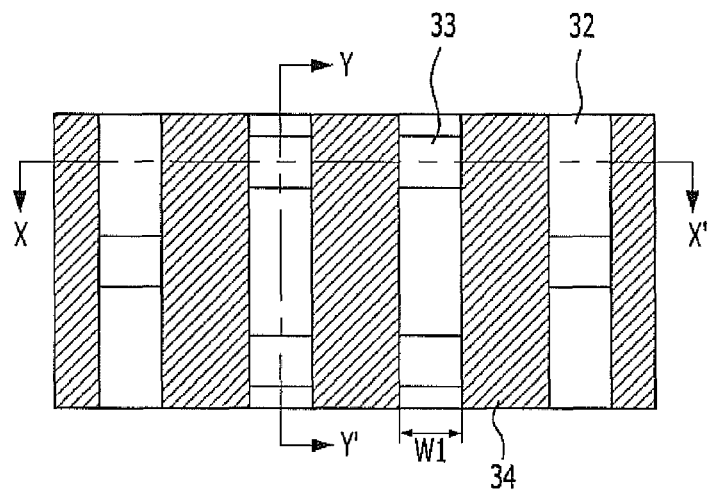
FIGS. 4A to 9C illustrate a method for fabricating the semiconductor device in accordance with the second embodiment of the present invention.
Figure 4B:
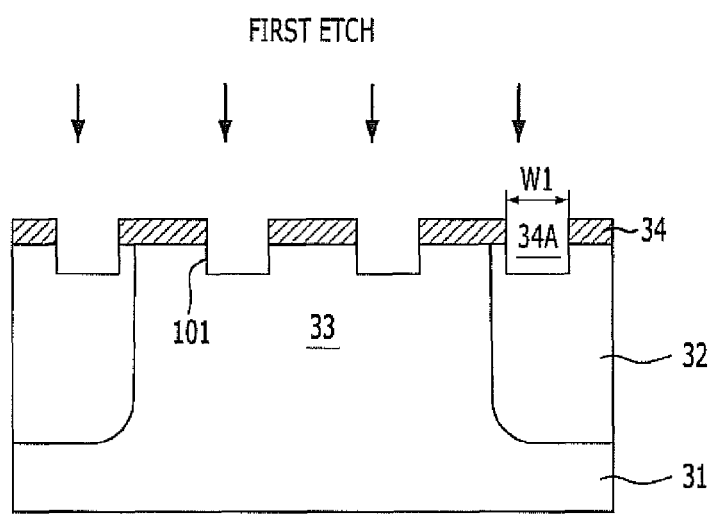
Figure 4C:
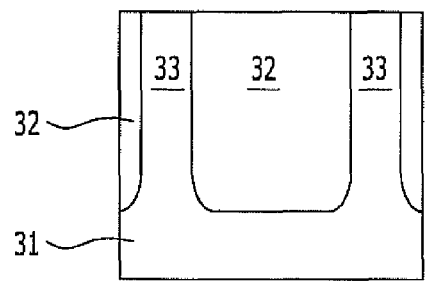

As shown in FIGS. 4A to 4C, an isolation layer 32 is formed in a substrate 31, e.g., a silicon (Si) substrate, for the device isolation. The isolation layer 32 may include an oxide layer such as a single layer or a stacked layer of a HDP oxide layer and a spin on dielectric (SOD) layer.

For instance, the isolation layer 32 including the stacked layer of the SOD layer and the HDP oxide layer is formed according to the following processes.

After forming an isolation mask (not shown) by sequentially stacking a pad oxide layer (not shown) and a pad nitride layer (not shown) on the substrate 31, a trench is formed by etching the substrate 31 using the isolation mask as an etch barrier. Then, after sequentially forming a sidewall oxide layer, a liner nitride layer and a liner oxide layer on a sidewall of the trench, a portion of the trench is filled with a SOD layer having an relatively superior gap-fill characteristic and then the remaining portion of the trench is filled with a HDP oxide layer having relatively greater hardness than the SOD layer. Subsequently, after performing annealing to improve the film quality of the SOD layer and the HDP oxide layer buried in the trench, a chemical-mechanical polishing (CMP) process is performed until a surface of the pad nitride layer is exposed. Through a sequence of processes of removing the pad nitride layer and the pad oxide layer, it is possible to form the isolation layer 32 constructed of the SOD layer and the HDP oxide layer that are it) sequentially stacked.

Herein, a portion of the substrate 31 where the isolation layer 32 is formed is defined as an isolation region and the remaining portion of the substrate 31 except the isolation region is defined as an active region 33.

Then, a first etch barrier pattern 34 is formed on the substrate 31 to expose a region where a gate to be formed. At this point, the first etch barrier pattern 34 may be formed of a line shape, which crosses the isolation layer 32 and the active region 33 at the same time. It is preferable that an opening 34A of the first etch barrier pattern 34 is formed to have the width greater than the width of the gate to be formed through a subsequent process, wherein the width of the opening 34A is substantially the same as the width W1 of a first pattern 101.

The first etch barrier pattern 34 acts as an etch barrier in a process of forming a recess pattern to form the channel with the saddle fin structure. Therefore, the first etch barrier pattern 34 may be formed of a single layer or a stacked layer selected from a group consisting of an oxide layer, a nitride layer, an oxynitride layer and an amorphous carbon layer. Among the above layers, the amorphous carbon layer having the selectivity to the active region 33 and the isolation layer 32 and capable of performing stable patterning of a line width of 40 nm may be used to form the first etch barrier pattern 34. For the reference, in case of forming a pattern having the line width of 40 nm using the oxide layer as an etch barrier, the oxide layer may be excessively damaged and thus it is difficult to stably obtain the pattern having the line width of 40 nm.

Moreover, it is preferable that the first etch barrier pattern 34 has the thickness in a range of approximately 1500 Å to approximately 2500 Å to provide a sufficient etch margin between subsequent processes.

A first etch process of etching the substrate 31 in certain depth using the first etch barrier pattern 34 as an etch barrier is performed to form the first pattern 101 having the line shape, which crosses the isolation region and the active region 33 at the same time. Herein, the first pattern 101 is to form the elevated source and drain region without using the epitaxial growth method. Therefore, the etch depth in the first etch process, i.e., the depth of the first pattern 101 may be adjusted by considering the junction depth of the elevated source/drain structure. In particular, it is preferable to perform the first etch process so that the etch depth in the first etch process is substantially the same as the junction depth of the elevated source/drain structure from the surface of the substrate 31. For instance, the etch depth in the first etch process is in a range of approximately 500 Å to approximately 800 Å.

Herein, the first etch process may be performed using a dry etch method and the dry etch method may use a plasma etch method. In this etch process, the active region 33 and the isolation layer 32 may be simultaneously etched using an etch gas whose selectivity to the active region 33 is the same as its selectivity to the isolation region 32, or the active region 33 and the isolation layer 32 may be sequentially etched using an etch gas whose selectivity to one of the active region 33 and the isolation region 32 is greater than that of the other one of the active region 33 and the isolation region 32.

Figure 5A:
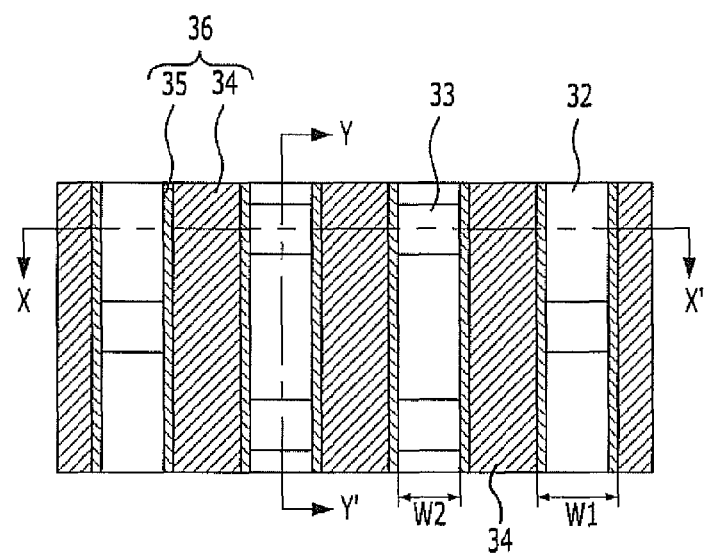
Figure 5B:
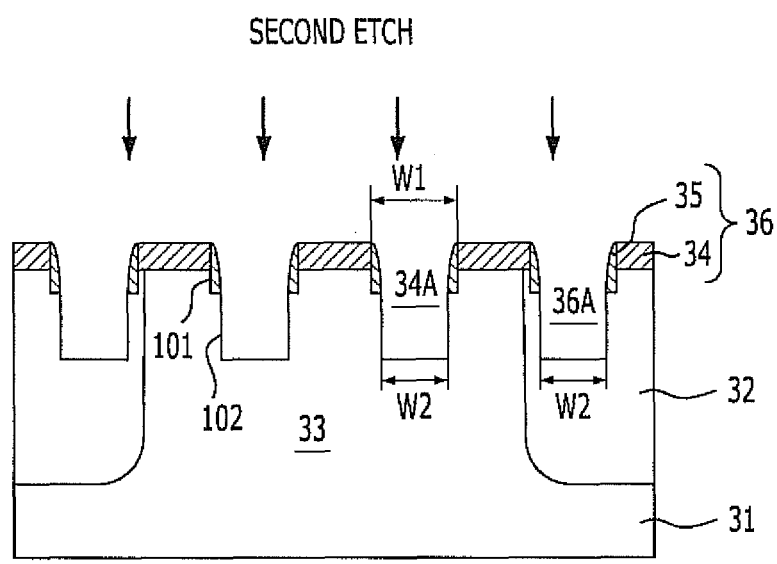
Figure 5C:
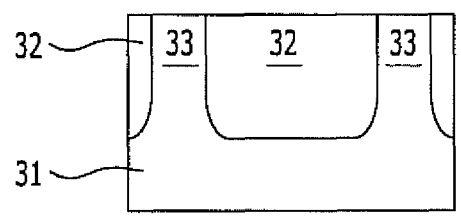

As shown in FIGS. 5A to 5C, a second etch barrier pattern 35 is formed on a portion of the substrate 31 that is exposed through the first etch process, i.e., on sidewalls of the first pattern 101 and sidewalls of the first etch barrier pattern 34. At this point, the second etch barrier pattern 35 may have a spacer structure.

Herein, the second etch barrier pattern 35 acts as an etch barrier together with the first etch barrier pattern 34 in a subsequent process of forming a recess pattern for the channel with the saddle fin structure. Accordingly, the second etch barrier pattern 35 may be formed of a single layer or a stacked layer selected from a group consisting of an oxide layer, a nitride layer, an oxynitride layer and an amorphous carbon layer and it is preferable to form the second etch barrier pattern 35 with the nitride layer having selectivity to the active region 33 and the isolation layer 32. The nitride layer may include a silicon nitride ($Si_3N_4$) layer. In addition, it is preferable to form the second etch barrier pattern 35 with a low temperature nitride layer of the temperature of approximately 400° C. to approximately 500° C. to prevent the lifting of the first etch barrier pattern 34 constructed of the amorphous carbon layer. Furthermore, it is preferable that the second etch barrier pattern 35 is formed to have the thickness in a range of approximately 100° C. to approximately 200° C. to provide a sufficient etch margin between subsequent processes.

In particular, the process of forming the second etch barrier pattern 35 having the spacer structure using the low temperature nitride layer is performed by forming the low temperature nitride layer at the temperature of approximately 400° C. to approximately 500° C. over the substrate 31 and then performing an overall etch process, e.g., an etch-back process, to remain the low temperature nitride layer on the sidewalls of the portion of the substrate 31 that are exposed in the first etch process and the sidewalls of the first etch barrier pattern 34.

Herein, a third etch barrier pattern 36 formed by the combination of the first etch barrier pattern 34 and the second etch barrier pattern 35 may have a line shape, which crosses the isolation layer 32 and the active region 33 at the same time, and the width of an opening 36A of the third etch barrier pattern 36 is smaller than the width of the opening 34A of the first etch barrier pattern 34. Furthermore, it is preferable that the width of the opening 36A of the third etch barrier pattern 36 is equal to or smaller than the width of a gate to be formed in a subsequent process, wherein the width of the opening 36A is substantially the same as the width W2 of a second pattern 102.

Subsequently, a second etch process is performed to form the second pattern 102 in the active region 33 that is connected to the bottom of the first pattern 101 and has the width smaller than that of the first pattern 101 by etching the substrate 31 in certain depth using the third etch barrier pattern 36, i.e., the first and second etch barrier patterns 34 and 35, as an etch barrier. At this time, since the third etch barrier pattern 36 has the line shape crossing the isolation region and the active region 33 at the same time, the same pattern as the second pattern 102 formed in the active region 33 is formed in the isolation layer 32.

The second etch process is performed to form the channel with the recess structure in the channel with the saddle fin structure that is obtained by combining the channel with the recess structure and the channel with the fin structure. For the reference, the channel with the recess structure plays a role of securing characteristic margins such as a threshold voltage and a data retention time margin due to the reduction of the channel length caused by the decrease of the design rule by increasing the effective channel length of the semiconductor device. Therefore, the etch depth in the second etch process, i.e., the depth of the second pattern 102 may be adjusted by considering the channel length in the channel with the recess structure. In particular, it is preferable to perform the second etch process so that the depth of the second pattern 102 is in a range of approximately 800 Å to approximately 1200 Å from the bottom of the first pattern 101. Accordingly, the etch depth in the second etch process is greater than that in the first etch process. Moreover, it is preferable to form the second pattern 102 having the depth smaller than that of the isolation layer 32 from the surface of the substrate 31 in order to prevent the increase of the leakage current. This is to prevent the interference between a gate electrode to be buried in the second pattern 102 in a subsequent process and its neighboring active region 33.

Meanwhile, the width W2 of the second pattern 102 may be adjusted according to the width of the opening 36A of the third etch barrier pattern 36, especially, the thickness of the second etch barrier pattern 35.

The second etch process may be performed using a dry etch method and the dry etch method may include a plasma etch method. In this etch process, the active region 33 and the isolation layer 32 may be simultaneously etched using an etch gas whose selectivity to the active region 33 is the same as its selectivity to the isolation region 32, or the active region 33 and the isolation layer 32 may be sequentially etched using an etch gas whose selectivity to one of the active region 33 and the isolation region 32 is greater than that of the other one of the active region 33 and the isolation region 32.

Through the above first and second etch processes, a step-type recess pattern including the first pattern 101 and the second pattern 102 may be formed in the active region 33, wherein the second pattern 102 has the width smaller than that of the first pattern 101 and is connected to the bottom of the first pattern 101. The width W1 of the first pattern 101 is greater than the width W2 of the second pattern 102.

In the meantime, after performing the second etch process, a spacer (not shown) constructed of a nitride layer is formed on a portion of a sidewall of the second pattern 102 adjacent to the first pattern 101 and then the second pattern 102 of a bulb type may be formed by additionally etching the sidewall of the second pattern 102 where the spacer is not formed, by performing an isotropic etch process using the spacer and the third etch barrier pattern 36 as an etch barrier.

Figure 6A:
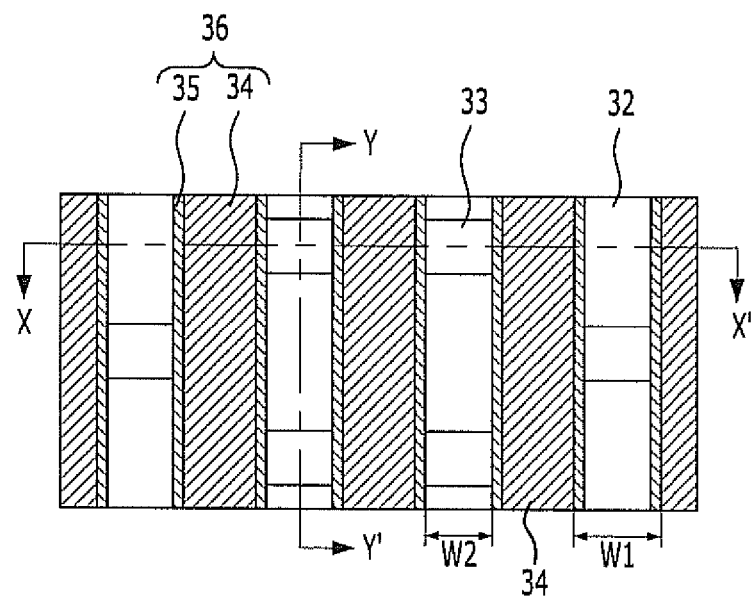
Figure 6B:
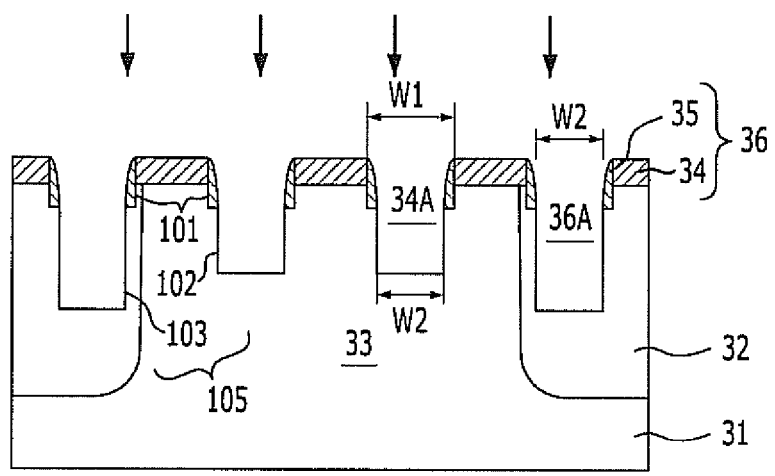
Figure 6C:
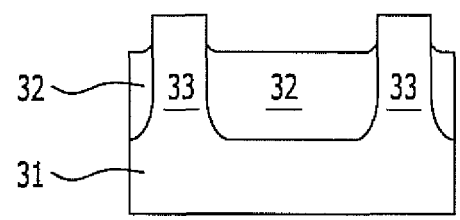

As illustrated in FIGS. 6A to 6C, a third etch process is performed to form a third pattern 103 in the isolation layer 32 by etching the isolation layer 32 using the third etch barrier pattern 36 as an etch barrier, wherein the third pattern 103 elevates the lower surface and the lower sidewalls of the second pattern 102 formed in the active region 33 with the saddle fin structure. At this point, since the third pattern 103 is formed using the third tech barrier pattern 36, the width of the third pattern 103 is substantially the same as the width W2 of the second pattern 102.

The third etch process is to form the channel with the fin structure. The channel with the fin structure improves the controllability of the gate against the channel and thus secures characteristic margins such as the current drivability margin and an operational speed margin of the semiconductor device. Therefore, the etch depth in the third etch process, i.e., the depth of the third pattern 103 may be adjusted by considering the channel length in the channel with the fin structure. In particular, it is preferable to perform the third etch process so that a lower surface of the second pattern 102 is approximately 300 Å to approximately 600 Å higher than a lower surface of the third pattern 103. Therefore, the etch depth in the third etch process is smaller than those in the first and second etch processes. This is because the same pattern as the second pattern 102 formed in the active region 33 is also formed in the isolation layer 32 through the second etch process described above.

Furthermore, it is preferable to form the depth of the third pattern 103 smaller than the depth of the isolation layer 32 from the surface of the substrate 31 to thereby prevent an electrical short and the interference between the substrate 31 and a gate electrode to be buried in the third pattern 103 in a subsequent process.

The third etch process may be performed using a dry etch method and the dry etch method may include a plasma etch method. At this point, it is preferable to etch only the isolation layer 32 in the third etch process to elevate a lower surface and lower sidewalls of the second pattern 102 with the saddle fin structure. Accordingly, it is preferable to perform the third etch process using an etch gas of etching only the isolation layer 32 without etching the active region 33. For instance, in case the active region 33 includes silicon (Si) and the isolation layer 32 includes a silicon oxide ($SiO_2$) layer, an etch gas of etching the silicon oxide layer without etching the silicon layer may include a mixed gas of a fluoric methane gas, a fluorocarbon gas and a mixed gas. The fluoric methane gas may use $CHF_3$ and the fluorocarbon gas may use $CF_4$ or $C_2F_6$, or both.

The second and third etch processes may be performed in-situ.

Through the above processes, the step-type saddle fin recess pattern 105 constructed of the first pattern 101, the second pattern 102 and the third pattern 103 is formed in the substrate 31.

Figure 7A:
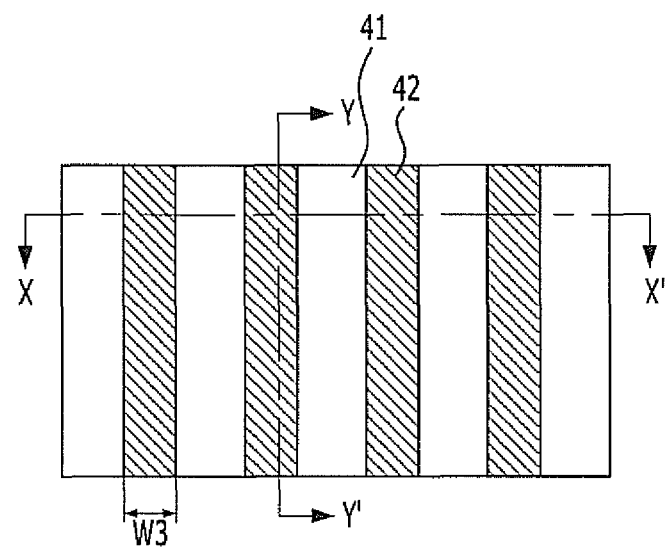
Figure 7B:
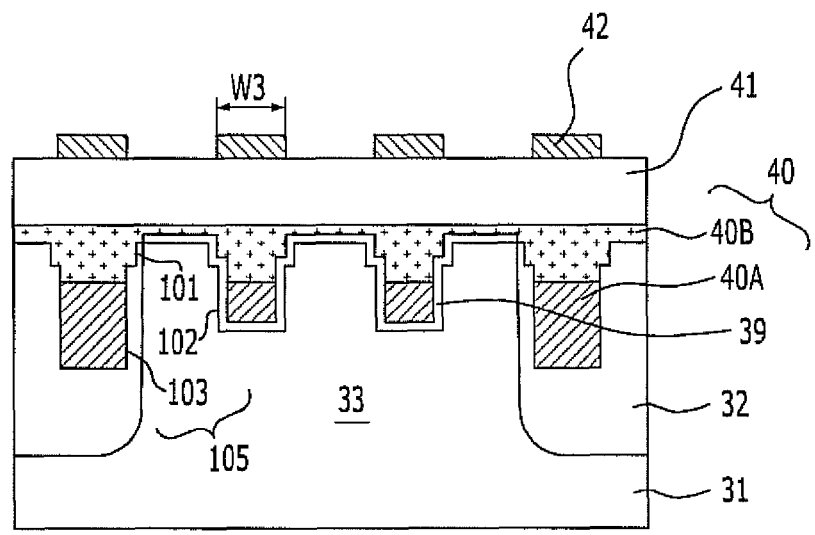
Figure 7C:
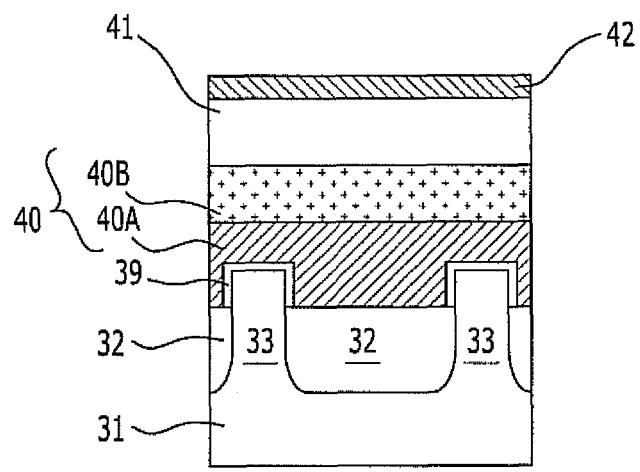

As illustrated in FIGS. 7A to 7C, after removing the third etch barrier pattern 36, a gate insulation layer 39 is formed on the surface of the recess pattern 105 including the lower sidewalls of the second pattern 102 exposed by the third pattern 103. Herein, the gate insulation layer 39 may be formed of an oxide layer and the oxide layer may include a silicon oxide ($SiO_2$) layer. The silicon oxide layer may be formed to have the thickness of approximately 30 Å to approximately 60 Å using a thermal oxidation method.

Then, the gate electrode 40 filling the inside of the recess pattern 105 is formed. As shown in FIGS. 7A to 7C, the gate electrode 40 may be formed to fully fill the recess pattern 105 and a portion of the gate electrode 40 may cover the surface of the substrate 31. Although it is not shown in figures, the gate electrode 40 may be formed to fill the recess pattern 105 and to have the same surface as that of the substrate 31.

The gate electrode 40 may include a single layer or a stacked layer selected from a group consisting of a polysilicon layer, a metallic layer and a conductive organic layer. The metallic layer may include a W layer, an Al layer, a TiN layer, an $IrO_2$ layer, a TiSi layer, a WSi layer, an ITO layer, an IZO layer, and so on. The conductive organic layer may include pentacene, tetracene, anthracene, and so on.

For instance, when the gate electrode 40 includes the stacked layer, the polysilicon layer 40A having an relatively superior interface characteristic for the silicon oxide layer, i.e., the gate insulation layer 39, may be formed to have the thickness of approximately 400 Å to approximately 700 Å and then the metallic layer 40B, e.g., the tungsten silicide layer or the tungsten layer, whose resistivity is less than that of the polysilicon layer 40A may be formed on the polysilicon layer 40A to have the thickness of approximately 1000 Å to approximately 1500 Å to thereby improve a signal transmission characteristic.

Herein, the gate electrode 40 overlapping with a source and drain region to be formed in a subsequent process, e.g., the metallic layer 40B may include a metallic material having a work function equal to a work function of the source and drain region or an absolute value of the difference between the work functions of the source and drain region and the metallic material less than 0.5 eV. This is to effectively suppress the leakage current, i.e., the GIDL, generated in a region where the gate electrode 40 overlaps with the source and drain region. The detailed description thereof is omitted herein since it was described in detail with reference to FIGS. 2A to 2C.

In the meantime, the step with a certain height may be generated at the top surface of the gate electrode 40 by the recess pattern 105. Since the step with the certain height generated at the top surface of the gate electrode 40 causes negative influences such as a profile failure on a sidewall of the gate in a subsequent process of patterning the gate and the deterioration of the gate patterning etch performance, it is preferable to remove the step generated at the top surface of the gate electrode 40. The step may be removed through a planarization process such as a chemical-mechanical polishing or etch-back process.

Subsequently, a gate hard mask layer 41 is formed on the gate electrode 40. The gate hard mask layer 41 plays a role of protecting the gate electrode 40 in subsequent processes and acts as an etch barrier in a gate patterning process and a self aligned contact (SAC) etch process.

The gate hard mask layer 41 may be formed of a single layer or a stacked layer selected from a group consisting of an oxide layer, a nitride layer, an oxynitride layer and an amorphous carbon layer and to have the thickness of approximately 2000 Å to approximately 2500 Å to thereby provide a sufficient etch margin between subsequent processes.

Then, a fourth etch barrier pattern 42 is formed on the gate hard mask layer 41. The fourth etch barrier pattern 42 is for the gate patterning process and may be formed to have a line shape crossing the isolation layer 32 and the active region 33 at the same time. The fourth etch barrier pattern 42 may be formed of photo resist (PR).

Herein, the width of the fourth etch barrier pattern 42 may be smaller than the width W1 of the first pattern 101 and equal to or greater than the width W2 of the second pattern 102 or the third pattern 103.

Figure 8A:
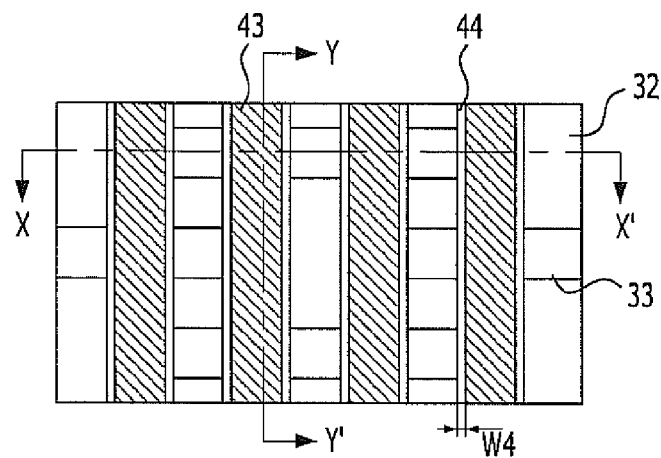
Figure 8B:
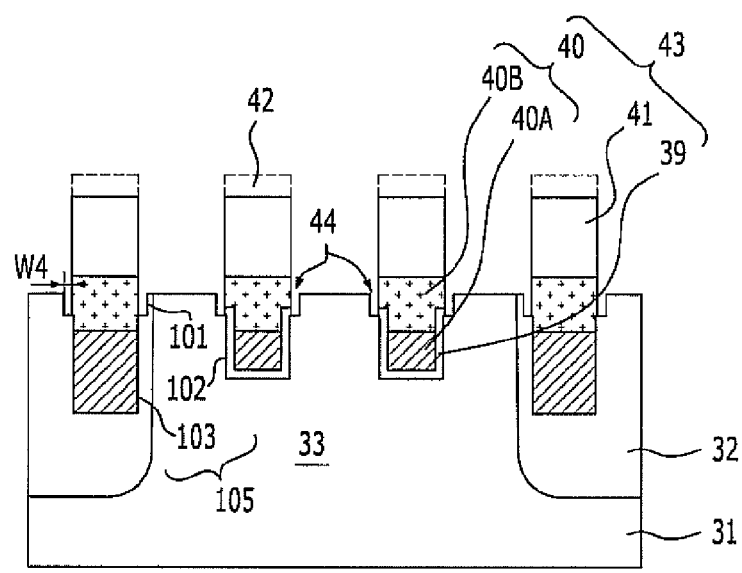
Figure 8C:
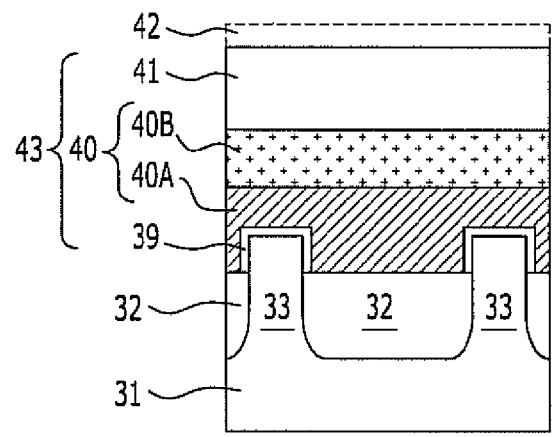

As illustrated in FIGS. 8A to 8C, the gate 43 having the gap 44 disposed between the gate 43 and the sidewalls of the recess pattern 105 is formed by sequentially etching the gate hard mask layer 41, the gate electrode 40 and the gate insulation layer 39 using the fourth etch barrier pattern 42 as an etch barrier. At this point, the width of the gate 43 is substantially the same as the width W3 of the gate electrode 40 and the width W3 of the gate electrode 40 is equal to or greater than the width W2 of the second pattern 102 and smaller than the width W1 of the first pattern 101.

Herein, the gap 44 plays a role of preventing the generation of the GIDL between the source and drain region to be formed through a subsequent process and the gate 43, specially, the gate electrode 40, an electrical short between the source and drain region and the gate 43, and the interference between the gate electrode 40 formed in the active region 33 and the gate electrode 40 formed in the isolation region, i.e., the passing gate effect. Therefore, it is preferable that the width W4 of the gap 44 is greater than the thickness of the gate insulation layer 39. Since the reason why the gap 44 is formed to have the width W4 greater than the thickness of the gate insulation layer 39 was already described in detail with reference to FIGS. 2A to 2C, the detailed description thereof is omitted herein.

Meanwhile, the fourth etch barrier pattern 42 may be fully removed during the process of forming the gate 43. In case the fourth etch barrier pattern 42 remains after the gate 43 is formed, it is preferable to perform a separate removing process, i.e., a strip process, to remove the remaining fourth etch barrier pattern 42 and then perform subsequent processes.

As a portion of the gate 43 is disposed under the surface of the substrate 31 through the above processes, a region where the source and drain region is to be formed, i.e., a portion of the substrate 31 at two sides of the gate 43, has the same structure as the elevated source/drain structure formed using the conventional epitaxial growth method. As a result, the method for fabricating the semiconductor device in accordance with the present invention can form the elevated source and drain region without using the epitaxial growth method.

Figure 9A:
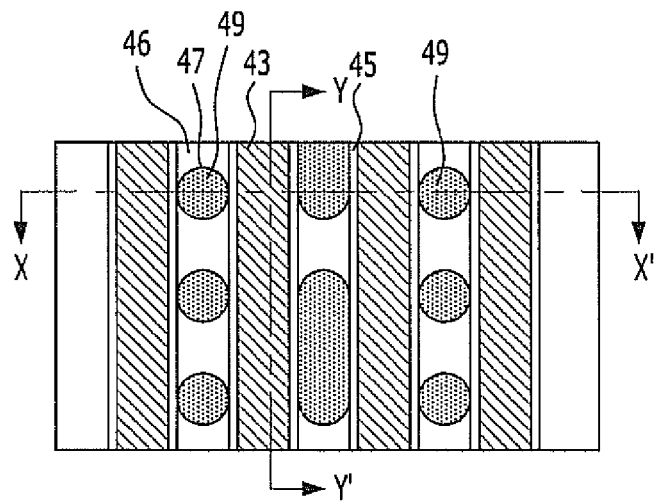
Figure 9B:
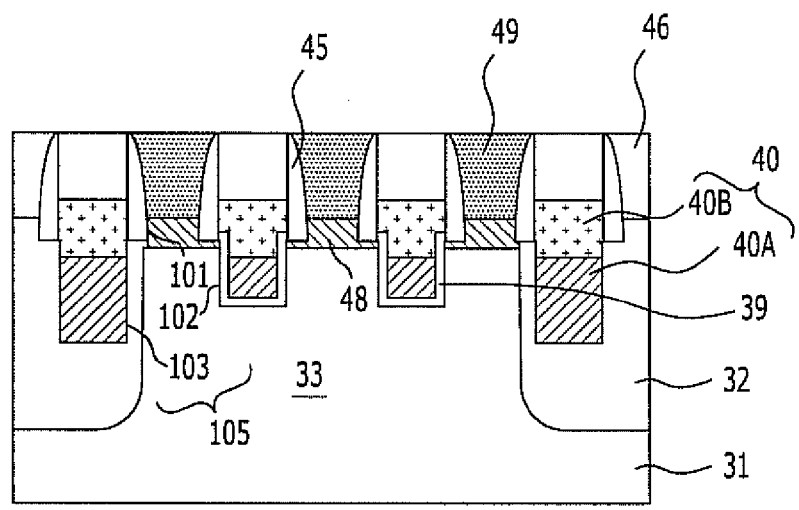
Figure 9C:
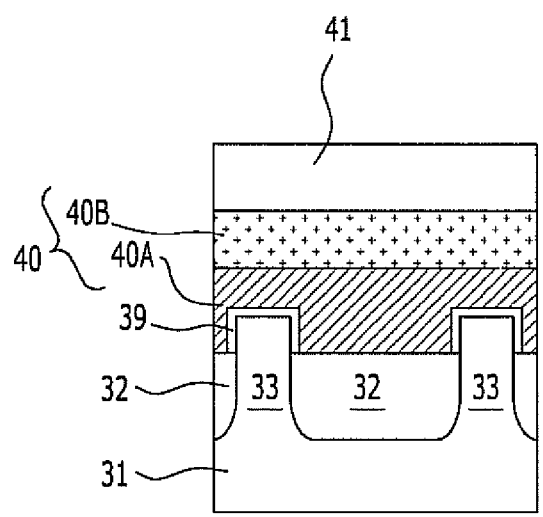

As illustrated in FIGS. 9A to 9C, an insulation layer 45 is formed to fill the gap 44. At this point, the insulation layer 45 may be formed with a spacer structure of filling the gap 44 and covering both sidewalls of the gate 43. The insulation layer 45 filling the gap 44 plays a role of protecting the both sidewalls of the gate 43 during subsequent processes, suppressing the generation of the leakage current due to the GIDL between the source and drain region and the gate 43, preventing the electrical short from occurring between the source and drain region and gate 43, and suppressing the generation of the passing gate effect.

The insulation layer 45 filling the gap 44 may be formed of a single layer or a stacked layer selected from a group consisting of an oxide layer, a nitride layer and an oxynitride layer. The insulation layer 45 may be formed to have the thickness greater than that of the gate insulation layer 39.

In particular, the method for forming the insulation layer 45 covering the sidewalls of the gate 43 and filling the gap 44 may be accomplished by forming the insulation layer 45 filling the gap 44 over the substrate 31 including the gate 43 and then performing an overall etching process, e.g., an etchback process, on the insulation layer 45 to remain the insulation layer 45 only on the sidewalls of the gate 43.

Hereinafter, a principle that the gap 44 and the insulation layer 45 filling the gap 44 suppress the generation of the GIDL and prevent the passing gate effect will be briefly described since the detailed description thereof was shown with reference to FIGS. 2A to 2C.

Subsequently, an inter-layer insulation layer 46 is formed to fill a space between the gates 43 over the substrate 31. Herein, the inter-layer insulation layer 46 may include an oxide layer, e.g., one selected from a group consisting of a silicon oxide ($SiO_2$) layer, a boron is phosphorus silicate glass (BPSG) layer, a phosphorus silicate glass (PSG) layer, a tetra ethyle ortho silicate (TEOS) layer, an un-doped silicate glass (USG) layer, a spin on glass (SOG) layer, a high density plasma (HDP) layer, a spin on dielectric (SOD) layer and a combination thereof.

After forming a self-aligned contact mask (not shown) on the inter-layer insulation layer 46, a contact hole 47 is formed by performing a self-aligned contact etch process of etching the inter-layer insulation layer 46 using the self-aligned contact mask as an etch barrier, wherein the contact hole 47 exposes a surface of a portion of the substrate 31 where the source and drain region is to be formed, i.e., a portion of the substrate 31 at two sides of the recess pattern 105 in the active region 33. Herein, the contact hole 47 is referred to as a landing plug contact (LPC) hole in general.

In the present invention, a portion of the gate 43 including the insulation layer 45 is disposed under the surface of the substrate 31 since the step-type saddle fin recess pattern 105, especially, the first pattern 101, is formed before the contact hole 47 is formed. That is, since the portion of the substrate 31 where the source and drain region is to be formed is elevated before the contact hole 47 is formed, the height of the stack of the gate 43 is reduced and thus the self-aligned contact etch process may be much more easily performed. Through this, it is possible to suppress the generation of etch by-products and the damage of the substrate 31 occurring in the self-aligned contact etch process.

Then, the source and drain region 48 having the shallow junction is formed by doping impurities into the substrate 31. In case of an NMOS transistor, the impurities may use N-type impurities such as phosphorus (P) and arsenic (As) and, in case of a PMOS transistor, the impurities may use P-type impurities such as boron (B).

The source and drain region 48 may be formed through various methods and exemplary methods will be described hereinafter.

According to one method, the source and drain region 48 may be formed by ion-implanting impurities into the substrate 31 using the inter-layer insulation layer 46, the gate 43 and the insulation 45 as an ion-implantation barrier and then performing thermal treatment to activate the ion-implanted impurities. This method has an advantage of easily adjusting the impurity doping concentration of the source and drain region 48.

According to another method, a conductive layer containing impurities is formed on the substrate 31. That is, a plug 49 is formed by filling the contact hole 47 with the conductive layer containing the impurities. Herein, the plug 49 may be referred to as a landing plug in general and formed of a polysilicon layer. Then, the source and drain region 48 can be formed by diffusing the impurities contained in the plug 49 into the substrate 31 through the thermal treatment. This method has an advantage of simplifying a sequence of the processes and thus improving the manufacturing effectiveness of the semiconductor device.

According to still another method, first impurities are ion-implanted into the substrate 31 using the inter-layer insulation layer 46, the gate 43 and the insulation layer 45 as an ion-implantation barrier. Then, a conductive layer containing second impurities is formed on the substrate 31 where the first impurities are ion-implanted. Namely, the plug 49 is formed by filling the contact hole 47 with the conductive layer containing the second impurities. Subsequently, the source and drain region 48 can be formed by activating the ion-implanted first impurities at the same time of diffusing the second impurities contained in the plug 49 into the substrate 31 through the thermal treatment. At this point, it is preferable that the first impurities and the second impurities have the same conductive type. This method has an advantage of effectively reducing contact resistance between the plug 49 and the source and drain region 48.

The semiconductor device in accordance with the second embodiment of the present invention can be fabricated through the above processes. The semiconductor device in accordance with the first embodiment of the present invention can be fabricated by omitting the third etch process of forming the third pattern 103 in the above processes.

Thus, the present invention can form the elevated source/drain structure without using the epitaxial growth method by forming the recess pattern 105, specially, the first pattern 101, in the substrate 31. Through this, the present invention can provide the method for fabricating the semiconductor device where the elevated source/drain structure is stably applied in the semiconductor device having a high degree of integration. Moreover, it is possible to originally prevent the problems occurring according to the forming of the elevated source/drain structure using the epitaxial growth method.

Furthermore, in accordance with the embodiments of the present invention, it is possible to suppress the increase of the leakage current, specially, the increase of the GIDL, due to smaller-scale manufacturing processes by applying the elevated source/drain structure to the semiconductor device to thereby form the source and drain region 48 having the shallow junction.

In accordance with the present invention, it is also possible to effectively suppress the increase of the GIDL by forming the insulation layer 45 filling the gap 44 to have the thickness greater than the thickness of the gate insulation layer 39.

In accordance with the present invention, it is possible to much more effectively suppress the generation of the GIDL by adjusting the difference of the word functions of the source and drain region 48 and the gate electrode 40.

Accordingly, it is possible to secure the data retention time margin required in the high density semiconductor device.

In accordance with the present invention, it is possible to easily perform the self-aligned contact etch process by forming the recess pattern 105 in the substrate 31 and filling the recess pattern 105 with a portion of the gate structure 43 including the insulation layer 45 to thereby elevate the portion of the substrate 31 where the source and drain region is to be formed.

Moreover, in accordance with the present invention, the passing gate effect can be suppressed by employing the insulation layer 45 filling the gap 44.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a step-type recess pattern in a substrate, wherein the step-type recess pattern includes a first pattern and a second pattern connected to a bottom of the first pattern and having the width smaller than the width of the first pattern;
   forming a gate electrode filling the recess pattern, wherein a gap is disposed between the gate electrode and upper sidewalls of the recess pattern;
   forming an insulation layer filling the gap; and
   forming a source region and a drain region by doping impurities into the substrate.

2. The method of claim 1, wherein the forming of the recess pattern comprises:
   performing a first etching of the substrate using a first etch barrier pattern as an etch barrier to form the first pattern;
   forming a second etch barrier pattern on sidewalls of the first pattern and sidewalls of the first etch barrier pattern; and
   performing a second etching of the substrate using the first and second etch barrier patterns as an etch barrier to form the second pattern.

3. The method of claim 2, wherein the performing a first etching and the performing a second etching are performed using a dry etch method.

4. The method of claim 2, wherein the depth of the second pattern is greater than the depth of the first pattern.

5. The method of claim 2, wherein the first etch barrier pattern comprises an amorphous carbon layer.

6. The method of claim 2, wherein the second etch barrier pattern comprises a nitride layer.

7. The method of claim 6, wherein the nitride layer is formed at the temperature of approximately 400° C. to approximately 500° C.

8. The method of claim 2, wherein the width of the gate electrode is equal to or greater than the width of the second pattern.

9. The method of claim 1, further comprising forming a gate insulation layer between the recess pattern and the gate electrode, wherein the width of the gap is greater than the thickness of the gate insulation layer.

10. The method of claim 1, wherein the insulation layer comprises a single layer or a stacked layer selected from a group consisting of an oxide layer, a nitride layer and an oxynitride layer.

11. The method of claim 1, wherein the forming of the insulation layer comprises:
   forming an insulating layer filling the gap and covering the entire surface of the substrate; and
   performing an overall etch process on the insulating layer to remain the insulating layer on sidewalls of the gate electrode, thereby forming the insulation layer.

12. The method of claim 1, wherein the forming of the source region and the drain region comprises:
   forming a conductive layer containing impurities over the substrate; and
   performing thermal treatment to diffuse the impurities contained in the conductive layer into the substrate.

13. The method of claim 1, wherein the forming of the source region and the drain region comprises:
   ion-implanting first impurities into the substrate;
   forming a conductive layer containing second impurities over the substrate; and performing thermal treatment to diffuse the second impurities contained in the conductive layer into the substrate at the same time of activating the first impurities ion-implanted into the substrate.

14. The method of claim 13, wherein the first impurities and the second impurities have the same conductive type.

15. The method of claim 1, wherein a work function of each of the source region and the drain region is equal to a work function of the gate electrode, or an absolute value of the work function difference of each of the source region and the drain region and the gate electrode is smaller than 0.5 eV.

16. The method of claim 1, wherein the gate electrode comprises a single layer formed of a semiconductor layer or a metallic layer, or a stacked layer of the semiconductor layer and the metallic layer.

17. The method of claim 16, wherein the semiconductor layer comprises a polysilicon layer and the metallic layer comprises a tungsten layer.

18. A method for fabricating a semiconductor device, the method comprising:
    forming a step-type saddle fin recess pattern by selectively etching a substrate including an active region and an isolation region, wherein the step-type saddle fin recess pattern includes at least a first pattern and a second pattern connected to a bottom of the first pattern and having the width smaller than the width of the first pattern;
    forming a gate electrode filling the recess pattern, wherein a gap is disposed between the gate electrode and upper sidewalls of the recess pattern;
    forming an insulation layer filling the gap; and
    forming a source region and a drain region by doping impurities into the substrate.

19. The method of claim 18, wherein the recess pattern comprises a line shape crossing both of the isolation region and the active region.

20. The method of claim 18, wherein the forming of the recess pattern comprises:
    performing a first etching of the substrate using a first etch barrier pattern as an etch barrier to form the first pattern crossing the isolation region and the active region at the same time;
    forming a second etch barrier pattern on sidewalls of the first pattern and sidewalls of the first etch barrier pattern;
    performing a second etching of the substrate using the first and second etch barrier patterns as an etch barrier to form the second pattern; and
    performing a third etching of the isolation region using the first and second etch barrier patterns as an etch barrier to form a third pattern connected to the bottom of the first pattern, having the width smaller than the width of the first pattern, and exposing a lower surface and lower sidewalls of the second pattern with a saddle fin structure.

21. The method of claim 20, wherein the performing a first etching, the performing a second etching and the performing a third etching are performed using a dry etch method.

22. The method of claim 20, wherein the performing a second etching and the performing a third etching are performed in-situ.

23. The method of claim 20, wherein, among the first to third patterns, the third pattern has the greatest depth and the first pattern has the smallest depth.

24. The method of claim 20, wherein the first etch barrier pattern comprises an amorphous carbon layer.

25. The method of claim 20, wherein the second etch barrier pattern comprises a nitride layer.

26. The method of claim 25, wherein the nitride layer is formed at the temperature of approximately 400° C. to approximately 500° C.

27. The method of claim 18, wherein the width of the gate electrode is equal to or greater than the width of the second pattern.

28. The method of claim 18, further comprising forming a gate insulation layer between the recess pattern and the gate electrode, wherein the width of the gap is greater than the thickness of the gate insulation layer.

29. The method of claim 18, wherein the insulation layer comprises a single layer or a stacked layer selected from a group consisting of an oxide layer, a nitride layer and an oxynitride layer.

30. The method of claim 18, wherein the forming of the insulation layer comprises:
    forming an insulating layer filling the gap and covering the entire surface of the substrate; and
    performing an overall etch process on the insulating layer to remain the insulating layer on sidewalls of the gate electrode, thereby forming the insulation layer.

31. The method of claim 18, wherein the forming of the source region and the drain region comprises:
    forming a conductive layer containing impurities over the substrate; and
    performing thermal treatment to diffuse the impurities contained in the conductive layer into the substrate.

32. The method of claim 18, wherein the forming of the source and drain region comprises:
    ion-implanting first impurities into the substrate;
    forming a conductive layer containing second impurities over the substrate; and
    performing thermal treatment to diffuse the second impurities contained in the conductive layer into the substrate at the same time of activating the first impurities ion-implanted into the substrate.

33. The method of claim 32, wherein the first impurities and the second impurities have the same conductive type.

34. The method of claim 18, wherein a work function of each of the source region and the drain region is equal to a work function of the gate electrode, or an absolute value of the work function difference of each of the source region and the drain region and the gate electrode is smaller than 0.5 eV.

35. The method of claim 18, wherein the gate electrode comprises a single layer formed of a semiconductor layer or a metallic layer, or a stacked layer of the semiconductor layer and the metallic layer.

36. The method of claim 35, wherein the semiconductor layer comprises a polysilicon layer and the metallic layer comprises a tungsten layer.

* * * * *